US012785698B2

(12) United States Patent
Wang

(10) Patent No.: US 12,785,698 B2
(45) Date of Patent: Nov. 3, 2026

(54) OSCILLATOR WITH OFFSET CALIBRATION

(71) Applicant: Xilinx, Inc., San Jose, CA (US)

(72) Inventor: Zhaowen Wang, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 135 days.

(21) Appl. No.: 18/424,236

(22) Filed: Jan. 26, 2024

(65) Prior Publication Data

US 2025/0247100 A1 Jul. 31, 2025

(51) Int. Cl.
*H03L 7/085* (2006.01)
*H03L 7/099* (2006.01)

(52) U.S. Cl.
CPC ............ *H03L 7/085* (2013.01); *H03L 7/0995* (2013.01)

(58) Field of Classification Search
CPC .............................. H03L 7/085; H03L 7/0995
See application file for complete search history.

(56) References Cited

U.S. PATENT DOCUMENTS

2024/0313787 A1* 9/2024 Park ........................ H03L 7/083
2025/0093896 A1* 3/2025 Varma ..................... G06F 1/329
2025/0141435 A1* 5/2025 Cui .................... H03K 5/00006

OTHER PUBLICATIONS

Bhatti, R. Z., "Phase Measurement and Adjustment of Digital Signals Using Random Sampling Technique," IEEE International Symposium on Circuits and Systems, Greece, Dec 1, 2006, p. 4, doi: 10.1109/ISCAS.2006.1693477.

Deng, W., et al., "A 0.022mm2 970uw dual-loop injection-locked PLL with 243dB FOM using synthesizable all-digital PVT calibration circuits", IEEE International Solid-State Circuits Conference Digest of Technical Papers, 3 pages, Feb. 19, 2013.

Dudek, P., et al., "A High-Resolution CMOS Time-to-Digital Converter Utilizing a Vernier Delay Line," in IEEE Journal of Solid-State Circuits, vol. 35, No. 2, pp. 240-247, Feb. 2000, doi: 10.1109/4.823449.

Gantsog, E., et al., "Theory and Demonstration of Noisy Oscillator Samplers for Clock Jitter and Phase Delay Measurement," in IEEE Transactions on Circuits and Systems I: Regular Papers, vol. 65, No. 5, pp. 1516-1528, May 2018, doi: 10.1109/TCSI.2017.2758339.

Mansuri, M., et al., "An On-Die All-Digital Delay Measurement Circuit with 250fs Accuracy," Symposium on VLSI Circuits (VLSIC), Jun. 2012, pp. 98-99, doi: 10.1109/VLSIC2012.6243808.

Wang, Z., et al., "Multi-Phase Clock Generation for Phase Interpolation With a Multi-Phase Injection-Locked ring Oscillator and a Quadrature Dll", IEEE Journal of Solid-State Circuits, vol. 57, No. 6, pp. 1776-1787, Jun. 2002.

* cited by examiner

*Primary Examiner* — Jeffrey M Shin
(74) *Attorney, Agent, or Firm* — Slater Matsil, LLP

(57) ABSTRACT

A method of using an oscillator circuit is disclosed. The method includes: with an oscillator, generating a plurality of output clock signals based on an override control signal; with a phase detector circuit, generating a phase error signal based on the output clock signals; with a gain stage circuit, modifying a feedback control signal based on the phase error signal and an offset compensation code; with a controller, modifying the offset compensation code; with a comparator, generating an equality signal indicating that the feedback control signal is equal to the override control signal; and with the controller, in response to the equality signal, causing the modified offset compensation code to be stored.

20 Claims, 8 Drawing Sheets

OSCILLATOR WITH OFFSET CALIBRATION

BACKGROUND

Oscillator circuits sometimes detect phase errors for use in feedback control of the oscillator frequency and or phase. Unfortunately, the circuits used to detect phase errors and to generate feedback signals may have offsets. The offsets may be due, for example, to mismatches caused by manufacturing imperfections, process, voltage, and temperature variations, and other factors known or unknown. The offsets reduce locking range, and in some situations, the offsets are significant enough that the offsets prevent the oscillator loop from locking.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the implementations and are not necessarily drawn to scale. The edges of features drawn in the figures do not necessarily indicate the termination of the extent of the feature.

DETAILED DESCRIPTION OF ILLUSTRATIVE IMPLEMENTATIONS

The making and using of various implementations are discussed in detail below. It should be appreciated, however, that the various implementations described herein are applicable in a wide variety of specific contexts. The specific implementations discussed are merely illustrative of specific ways to make and use various implementations, and should not be construed in a limited scope. Unless specified otherwise, the expressions "about", "around", "approximately", "substantially", and other unspecifying terms signify within 10%, and preferably within 5% of the given value or, such as in the case of substantially zero, less than 10% and preferably less than 5% of a comparable quantity. Unless specified otherwise, the expressions "equal", "similar", "proportional", or other relational terms are understood to signify or include that the relation is substantially equal, substantially similar, substantially proportional, etc.

The implementations discussed herein use an injection locked ring oscillator (ILRO) circuit having oscillator delay elements which have delays which are affected by a power or control voltage input. The power or control voltage input is generated based on phase differences in the output clock signals in a feedback loop which optimizes the phase differences in the output clock signals, where the circuitry used to detect the phase differences and to generate the power or control voltage has an undesirable offset. In some implementations, a calibration sequence is used to program the circuitry used to detect the phase differences and to generate the power or control voltage to compensate or partially compensate for the offset.

Figure 1:
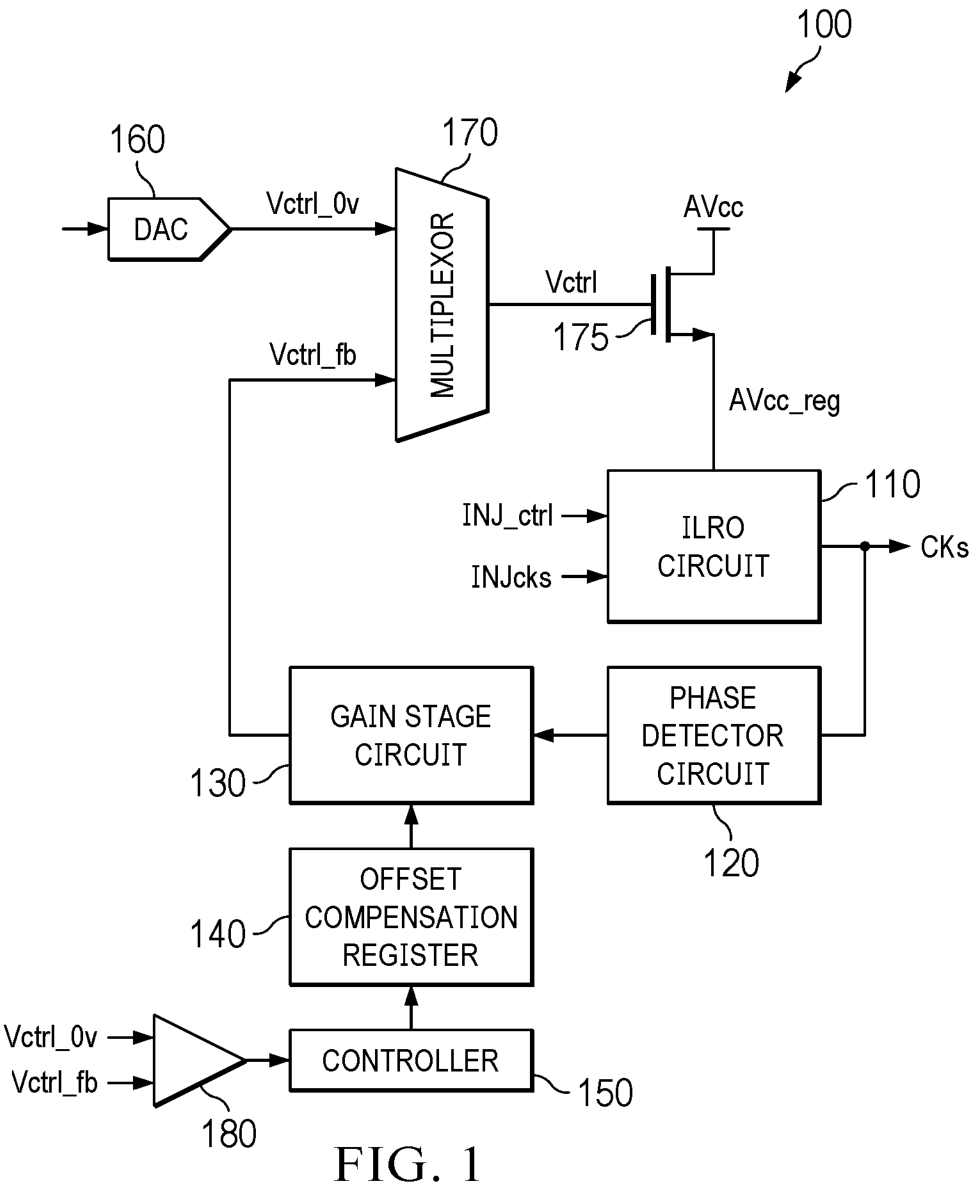
FIG. 1 illustrates an oscillator circuit according to some implementations.

FIG. 1 illustrates an oscillator circuit 100 according to some implementations. Oscillator circuit 100 generates output clock signals CKs, which are phase separated by an approximately constant difference in phase. For example, the output clock signals CKs may include four output clock signals separated by approximately 90 degrees in phase. In some embodiments, the output clock signals CKs are separated by approximately 45 degrees (or another amount) in phase. In the illustrated implementation, oscillator circuit 100 includes injection locked ring oscillator (ILRO) circuit 110, phase detector circuit 120, gain stage circuit 130, offset compensation register 140, controller 150, digital to analog converter (DAC) 160, multiplexor 170, power supply transistor 175, and comparator 180.

ILRO circuit 110 is configured to receive injection control signals INJ_ctrl, from, for example, a decoder circuit. ILRO circuit 110 is also configured to receive injection clock signals INJcks and a power signal AVcc_reg. In addition, ILRO circuit 110 is configured to generate the output clock signals CKs based on the injection control signals INJ_ctrl, injection clock signals INJcks, and power signal AVcc_reg.

The injection clock signals INJcks are phase separated and define the frequency of the output clock signals CKs. The injection clock signals INJcks are aligned with the injection control signals INJ_ctrl such that the injection control signals INJ_ctrl define a magnitude or strength of the current injections which occur in response to each of the injection clock signals INJcks. Data defining the magnitude or strength of each of the injection control signals INJ_ctrl are determined by a controller or processor, such as controller 150.

ILRO circuit 110 may include a number of delay elements having a circuit driving capacity which is influenced or determined by power signal AVcc_reg, which, during a normal operation mode, is generated by gain stage circuit 130, multiplexor 170, and power supply transistor 175 in response to the voltage output signal generated by phase detector circuit 120, and during a calibration mode, is generated by DAC 160, multiplexor 170, and power supply transistor 175. In alternative embodiments, ILRO circuit 110 may have delay elements whose driving capacity is influenced by other circuit mechanisms. For example, in some embodiments, the driving capacity of the delay elements may be influenced by a bias voltage which, during a normal operation mode, is generated by gain stage circuit 130, multiplexor 170, and a gain stage in response to the voltage output signal generated by phase detector circuit 120, and during a calibration mode, is generated by DAC 160, multiplexor 170, and the gain stage. In some embodiments, the driving capacity of the delay elements may be influenced by an ILRO load which is similarly controlled during normal and calibration modes.

Phase detector circuit 120 receives output clock signals CKs from ILRO circuit 110. In addition, phase detector circuit 120 generates a differential voltage output signal for gain stage circuit 130 based on phase differences of pairs of output clock signals CKs.

Gain stage circuit 130 receives the differential voltage output signal from phase detector circuit 120, receives an offset compensation code from offset compensation register 140, and generates a feedback control signal Vctrl_fb based on the differential phase output signal and the offset compensation code. During the normal operation mode, the feedback control signal Vctrl_fb is provided to power supply transistor 175 by multiplexor 170. During the normal operation mode, in response to the feedback control signal Vctrl_fb, the power transistor 175 generates the power signal AVcc_reg based on the feedback control signal Vctrl_fb.

In some implementations, during the normal operation mode, phase differences between the output clocks CKs cause the phase detector circuit 120 and the gain stage circuit 130 to cooperatively modify the power signal AVcc_reg such that the delay elements of ILRO circuit 110 have either increased or decreased driving capacity. The phase differences in the output clocks CKS are represented in the power signal AVcc_reg such that the power signal AVcc_reg presents a negative feedback control signal for ILRO circuit 110. Therefore, after the loop settles, the phase differences are optimized to be equal or to be substantially equal to a desired phase shift, such as 45 degrees.

During the calibration mode, the offset compensation code is determined by controller 150, and is stored in offset compensation register 140.

During the calibration mode, the controller 150 causes the ILRO circuit 110 to operate at a particular frequency by providing a frequency code to DAC 160. In response to the frequency code, DAC 160 generates an override control signal Vctrl_ov. The frequency code may have been determined in a previously performed calibration sequence. The controller 150 also causes the multiplexor 170 to provide the override control signal Vctrl_ov to the gate of power supply transistor 175. In response to the power signal AVcc_reg generated by power supply transistor 175 based on override control signal Vctrl_ov, ILRO circuit 110 operates at the particular frequency.

During the calibration mode, the controller 150 controls injection clock signals INJcks and the injection control signals INJ_ctrl such that ILRO circuit 110 receives no injection signals. Accordingly, ILRO circuit 110 operates at the particular frequency with little or no phase error in the output clock signals CKs.

During the calibration mode, the controller 150 provides candidate offset compensation codes to offset compensation register 140 while monitoring or sensing an equality signal output of comparator 180. Using a search algorithm, such as a ramp, or a binary search, the controller 150, based on the equality signal, determines which candidate offset compensation code causes the feedback control signal Vctrl_fb to be equal to, substantially equal to, closest to, or second closest to the override control signal Vctrl_ov. Once the controller determines which particular candidate offset compensation code causes the feedback control signal Vctrl_fb to be equal to, substantially equal to, closest to, or second closest to the override control signal Vctrl_ov, the controller 150 causes the particular candidate offset compensation code to be stored in the offset compensation register 140.

Accordingly, during the normal operation mode, deviations in the feedback control signal Vctrl_fb from the value determined during the calibration are caused by phase differences in the output clock signals CKs, and therefore provide appropriate negative feedback in the power signal AVcc_reg, which cause the loop to minimize the phase differences.

Figure 2:
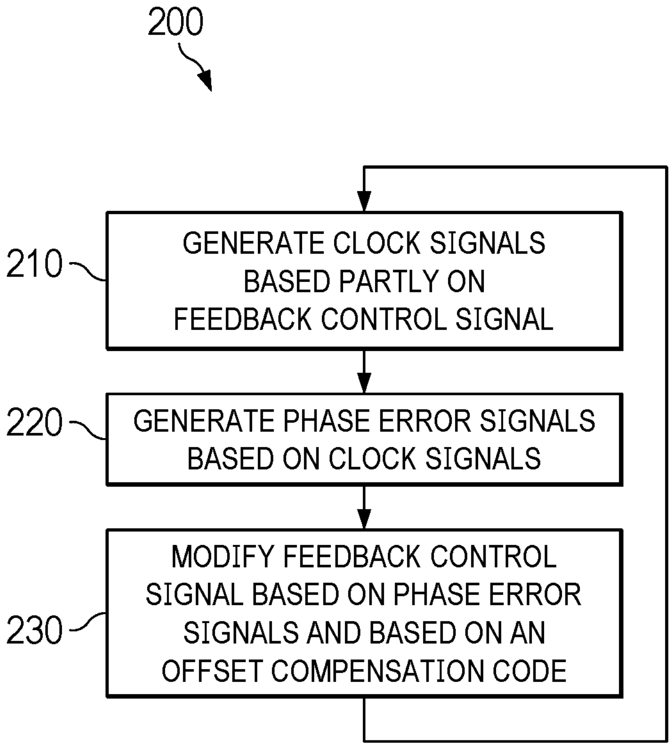
FIG. 2 is a flowchart diagram illustrating a method of operating an oscillator circuit according to some implementations.

FIG. 2 is a flowchart diagram illustrating a method 200 of operating an oscillator circuit during a normal operation mode according to some implementations. Method 200 may be performed, for example, by oscillator circuit 100, or by controller 150 of oscillator circuit 100. Method 200 may be performed by other oscillator circuits or controllers.

At block 210, an oscillator circuit generates clock signals separated by approximately a fixed number of degrees. For example, the oscillator circuit may generate eight output clock signals separated by approximately 45 degrees. The output clock signals may be generated based on injection signals and based on a power or control signal, where the power or control signal influences a delay of a plurality of delay elements of an ILRO circuit.

At block 220, a phase error signal may be generated based on the output clock signals. For example, a differential phase error signal may be generated based on particular pairs of the output clock signals. For example, phase differences between any of a first set of pairs of output clock signals may cause the differential phase error signal to increase, and phase differences between any of a second set of pairs of output clock signals may cause the differential phase error signal to decrease.

At block 230, the power or control signal used at block 210 to generate the output clock signals is adjusted based on the phase error signal generated at block 220 and based on an offset compensation code, for example, stored in an offset compensation register. For example, in response to the differential phase signal increasing, the power or control signal may be increased, and, in response to the differential phase signal decreasing, the power or control signal may be decreased.

The effect of the phase differences in the output clock signals are represented in the power signal AVcc_reg such that the power signal AVcc_reg presents a negative feedback phase signal for the ILRO circuit. Therefore, after the loop settles, the phase differences are optimized to be equal or to be substantially equal to a target value, such as 45 degrees.

Figure 3:
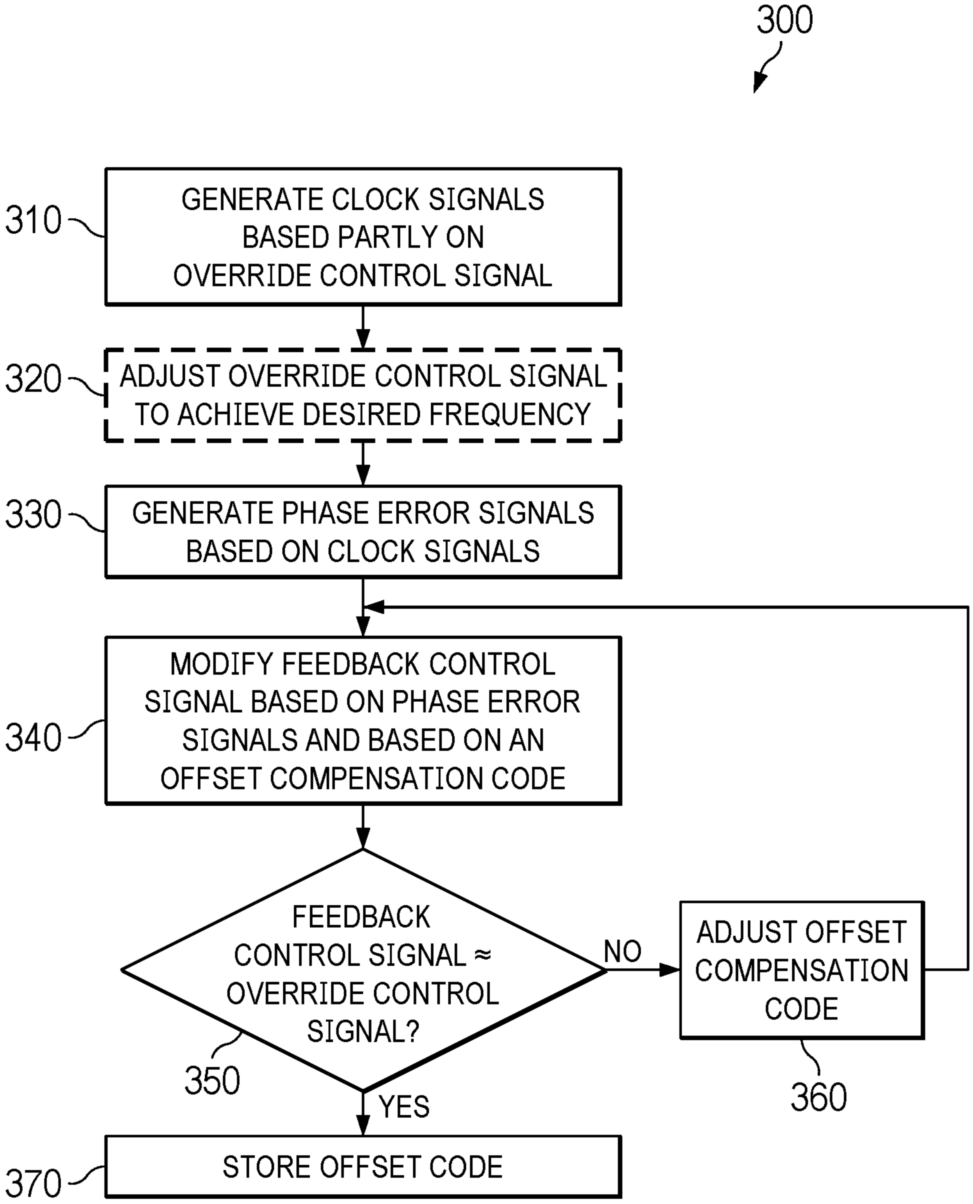
FIG. 3 is a flowchart diagram illustrating a method of operating an oscillator circuit according to some implementations.

FIG. 3 is a flowchart diagram illustrating a method 300 of calibrating an oscillator circuit according to some implementations. Method 300 may be performed, for example, by oscillator circuit 100, or by controller 150 of oscillator circuit 100. Method 300 may be performed by other oscillator circuits or controllers.

At block 310, the controller causes the output clocks to be generated based partly on an override control signal. For example, the controller may provide a digital frequency code to a DAC, and in response to the digital frequency code, the DAC may generate an override control signal. The controller may also cause a multiplexor to provide the override control signal to a gate of a power supply transistor, which, in response to the override control signal, generates a power signal for the ILRO circuit. In response to the power signal, the ILRO circuit generates the output clocks, where the output clocks have a frequency corresponding with the digital frequency code.

At block 320, the controller adjusts the digital frequency code so that the frequency of the output clocks is within a threshold of a predetermined target frequency. In some embodiments, the digital frequency code corresponding to the frequency of the output clocks being within the threshold of the predetermined target frequency, is stored in a memory.

In some embodiments, the digital frequency code may have been determined prior to method 300 being performed. Accordingly, some embodiments of method 300 include block 320, and other embodiments of method 300 do not include block 320.

At block 330, while the output clocks are being generated based partly on the override control signal, a phase error signal is generated based on the output clocks. For example, a differential phase error signal may be generated based on particular pairs of the output clock signals. For example, phase differences between any of a first set of pairs of output clock signals may cause the differential phase error signal to increase, and phase differences between any of a second set of pairs of output clock signals may cause the differential phase error signal to decrease.

At block 340, a feedback control signal is adjusted based on the phase error signal generated at block 330 and based on a current offset compensation code, for example, stored in an offset compensation register. In this embodiment, the feedback control signal does not affect the output clocks generated at block 310. For example, in response to the phase error signal increasing, the feedback control signal may be increased, and, in response to the phase error signal decreasing, the feedback control signal may be decreased.

At block 350, the controller determines whether a difference between the feedback control signal and the override control signal is less than a threshold.

If, at 350, the difference between the feedback control signal and the override signal is determined to not be less than the threshold, at 360 the offset compensation code in the offset compensation register is changed.

If, at 350, the difference between the feedback control signal and the override signal is determined to be less than the threshold, at 370, the current offset compensation code used at block 340 is stored in a memory, which may be the offset compensation register or another memory.

While method 300 is being performed, the injection of the ILRO circuit is disabled, such that the ILRO circuit is in a free-running state, and its phase differences are spaced by 45 degrees, unlike when the ILRO circuit receives injection signals, and the injection signals disturb the phase relationship and causes phase errors. When used in a system like oscillator circuit 100, the phase errors are detected by a phase detector, and are minimized by the feedback loop.

Figure 4:
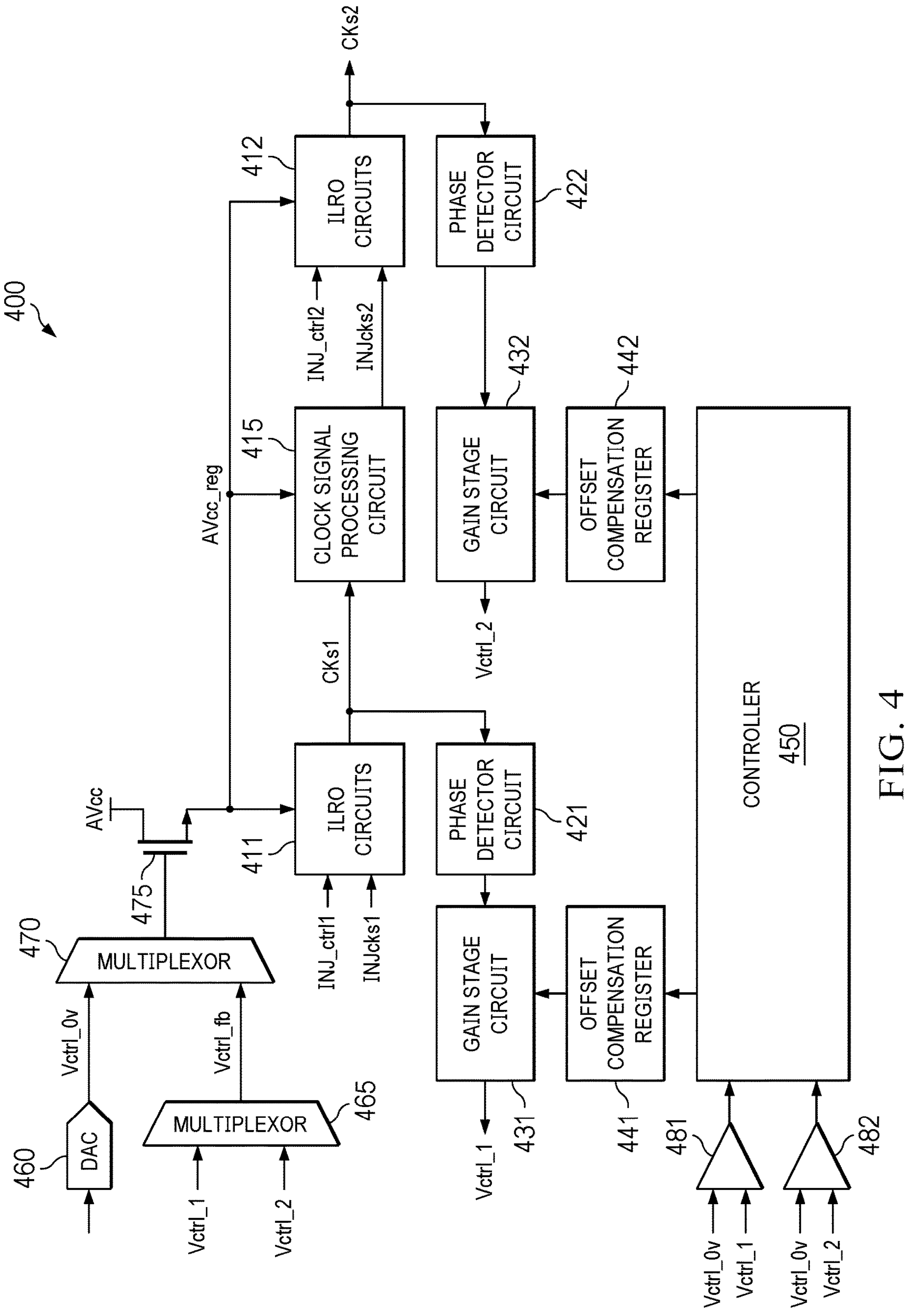
FIG. 4 illustrates an oscillator circuit according to some implementations.

FIG. 4 illustrates an oscillator circuit 400 according to some implementations. Oscillator circuit 400 generates output clock signals CKs2, which are phase separated by an approximately constant difference in phase. For example, the output clock signals CKs2 may include four output clock signals separated by approximately 90 degrees in phase. In some embodiments, the output clock signals CKs2 are separated by approximately 45 degrees (or another amount) in phase. In the illustrated implementation, oscillator circuit 400 includes injection locked ring oscillator (ILRO) circuit 410, phase detector circuit 420, gain stage circuit 430, offset compensation register 440, controller 450, digital to analog converter (DAC) 460, multiplexor 470, power supply transistor 475, and comparator 480.

ILRO circuit 411 is configured to receive injection control signals INJ_ctrl1, from, for example, a decoder circuit. ILRO circuit 411 is also configured to receive injection clock signals INJcks1 and a power signal AVcc_reg. ILRO circuit 411 may include a number of delay elements having a circuit driving capacity which is influenced or determined by power signal AVcc_reg. In addition, ILRO circuit 411 is configured to generate the output clock signals CKs1 based on the injection control signals INJ_ctrl1, injection clock signals INJcks1, and power signal AVcc_reg.

The injection clock signals INJcks1 are phase separated and define the frequency of the output clock signals CKS1. The injection clock signals INJcks1 are aligned with the injection control signals INJ_ctrl1 such that the injection control signals INJ_ctrl1 define a magnitude or strength of the current injections which occur in response to each of the injection clock signals INJcks1. Data defining the magnitude or strength of each of the injection control signals INJ_ctrl1 are determined by a controller or processor, such as controller 450.

Clock signal processing circuit 415 receives output clocks CKs1, and generates injection clock signals INJcks2. In some embodiments, clock signal processing circuit 415 includes a skew adjust circuit which aligns the clock signals being processed. In some embodiments, clock signal processing circuit 415 comprises a phase interpolator circuit, which generates the injection clock signals INJcks2 based on phases of the clock signals being processed.

ILRO circuit 412 is configured to receive injection clock signals INJcks2, from clock signal processing circuit 415. ILRO circuit 412 is also configured to receive injection control signals INJ_ctrl2 and the power signal AVcc_reg. ILRO circuit 412 may include a number of delay elements having a circuit driving capacity which is influenced or determined by power signal AVcc_reg. In addition, ILRO circuit 412 is configured to generate the output clock signals CKs2 based on the injection control signals INJ_ctrl2, injection clock signals INJcks2, and power signal AVcc_reg.

The injection clock signals INJcks2 are phase separated and define the frequency of the output clock signals CKs2. The injection clock signals INJcks2 are aligned with the injection control signals INJ_ctrl2 such that the injection control signals INJ_ctrl2 define a magnitude or strength of the current injections which occur in response to each of the injection clock signals INJcks2. Data defining the magnitude or strength of each of the injection control signals INJ_ctrl2 are determined by a controller or processor, such as controller 450.

Phase detector circuit 421 receives output clock signals CKs1 from ILRO circuit 411. In addition, phase detector circuit 421 generates a differential phase output signal for gain stage circuit 431 based on phase differences of pairs of output clock signals CKS1.

Gain stage circuit 431 receives the differential phase output signal from phase detector circuit 421, receives an offset compensation code from offset compensation register 441, and generates a feedback control signal Vctrl_1 based on the differential phase output signal and the offset compensation code.

Phase detector circuit 422 receives output clock signals CKs2 from ILRO circuit 412. In addition, phase detector circuit 422 generates a differential phase output signal for gain stage circuit 432 based on phase differences of pairs of output clock signals CKs2.

Gain stage circuit 432 receives the differential phase output signal from phase detector circuit 422, receives an offset compensation code from offset compensation register 442, and generates a feedback control signal Vctrl_2 based on the differential phase output signal and the offset compensation code.

During a normal operation mode, one of feedback control signals Vctrl_1 and Vctrl_2 is provided to power supply transistor 475 by multiplexors 465 and 470. During the normal operation mode, in response to the feedback control signal Vctrl_1 or Vctrl_2, the power supply transistor 475 generates the power signal AVcc_reg based on the feedback control signal Vctrl_fb.

ILRO circuits 411 and 412 may each include a number of delay elements having a circuit driving capacity which is influenced or determined by power signal AVcc_reg. During the normal operation mode, power signal AVcc_reg is generated by either phase to voltage circuit 431 or gain stage circuit 432, multiplexor 465, multiplexor 470, and power supply transistor 475 in response to the phase output signal generated by either phase detector circuit 421 or phase detector circuit 422. During a calibration mode, power signal AVcc_reg is generated by DAC 460, multiplexor 470, and power supply transistor 475.

In some implementations, during the normal operation mode, phase differences between the output clocks CKs1 or between the output clocks CKs2 cause the phase detector circuit 421 or the phase detector circuit 422, and the gain stage circuit 431 or the gain stage circuit 432 to cooperatively modify the power signal AVcc_reg such that the delay elements of ILRO circuit 411 or the delay elements of ILRO circuit 412 have either increased or decreased driving capacity. The phase differences in the output clocks CKs1 or output clocks CKs2 are represented in the power signal AVcc_reg such that the power signal AVcc_reg presents a negative feedback control signal for ILRO circuit 411 or ILRO circuit 412. Therefore, after the loop settles, the phase differences in output clocks CKs1 or CKs2 are optimized to be equal or to be substantially equal to a desired phase shift, such as 45 degrees.

During the calibration mode, the offset compensation code is determined by controller 450, and is stored in offset compensation register 440.

During the calibration mode, the controller 450 causes the ILRO circuits 411 and 412 to operate at a particular frequency by providing a frequency code to DAC 460. In response to the frequency code, DAC 460 generates an override control signal Vctrl_ov. The frequency code may have been determined in a previously performed calibration sequence. The controller 450 also causes the multiplexor 470 to provide the override control signal Vctrl_ov to the gate of power supply transistor 475. In response to the power signal AVcc_reg generated by power supply transistor 475 based on override control signal Vctrl_ov, ILRO circuits 411 and 412 operate at or about at the particular frequency.

During the calibration mode, the controller 450 controls injection clock signals INJcks1 and the injection control signals INJ_ctrl1 such that ILRO circuit 411 receives no injection signals. Accordingly, ILRO circuit 411 operates at or about at the particular frequency with little or no phase error in the output clock signals CKS1. During the calibration mode, the controller 450 also controls injection clock signals INJcks1 such that ILRO circuit 412 receives no injection signals. Accordingly, ILRO circuit 412 operates at or about at the particular frequency with little or no phase error in the output clock signals CKs2.

During the calibration mode, the controller 450 provides candidate offset compensation codes to either offset compensation register 441 or offset compensation register 442 while monitoring or sensing an equality signal output of corresponding comparator 481 or 482. Using a search algorithm, such as a ramp, or a binary search, the controller 450, based on the equality signal, determines which candidate offset compensation code causes the corresponding feedback control signal Vctrl_1 or Vctrl_2 to be equal to, substantially equal to, closest to, or second closest to the override control signal Vctrl_ov. Once the controller determines which particular candidate offset compensation code causes the corresponding feedback control signal Vctrl_1 or Vctrl_2 to be equal to, substantially equal to, closest to, or second closest to the override control signal Vctrl_ov, the controller 450 causes the particular candidate offset compensation code to be stored in the corresponding offset compensation register 441 or 442.

Accordingly, during the normal operation mode, gain stage circuit 431 or 432 operates according to the compensation offset code stored in the corresponding offset compensation register 441 or 442, and deviations in the feedback control signal Vctrl_fb from the value determined during the calibration are caused by phase differences in the output clock signals CKs1 or CKs2, and therefore provide appropriate negative feedback in the power signal AVcc_reg, which cause the loop to minimize the phase differences.

Figure 5:
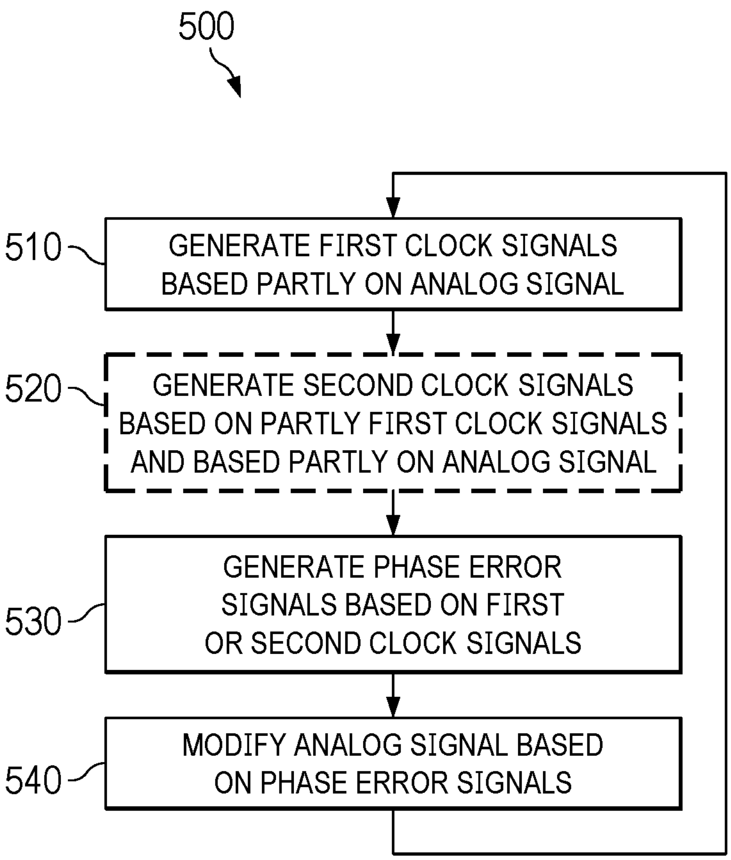
FIG. 5 is a flowchart diagram illustrating a method of operating an oscillator circuit according to some implementations.

FIG. 5 is a flowchart diagram illustrating a method 500 of operating an oscillator circuit during a normal operation mode according to some implementations. Method 500 may be performed, for example, by oscillator circuit 400, or by controller 450 of oscillator circuit 400. Method 500 may be performed by other oscillator circuits or controllers.

At block 510, a first oscillator circuit generates first output clock signals separated by approximately a fixed number of degrees. For example, the first oscillator circuit may generate eight output clock signals separated by approximately 45 degrees. The first output clock signals may be generated based on first injection signals and based on a first power or control signal, where the first power or control signal influences a delay of a plurality of delay elements of the first oscillator circuit.

At block 520, a second oscillator circuit generates second output clock signals separated by approximately a fixed number of degrees. For example, the second oscillator circuit may generate eight output clock signals separated by approximately 45 degrees. The second output clock signals may be generated based on second injection signals and based on the first power or control signal, where the first power or control signal influences a delay of a plurality of delay elements of the second oscillator circuit. In some embodiments, at least some of the operations of block 520 are omitted.

In some embodiments, the digital frequency code may have been determined prior to method 500 being performed. Accordingly, some embodiments of method 500 include block 520, and other embodiments of method 500 do not include block 520.

At block 530, a phase error signal may be generated based on the first or second output clock signals. For example, a differential phase signal may be generated based on particular pairs of the first or second output clock signals. For example, phase differences between any of a first set of pairs of the first or second output clock signals may cause the differential phase signal to increase, and phase differences between any of a second set of pairs of the first or second output clock signals may cause the differential phase signal to decrease.

At block 540, the first power or control signal used at block 510 to generate the first output clock signals and used at block 520 to generate the second output clock signals is adjusted based on the phase error signal generated at block 530 and based on the offset compensation code, for example, stored in either a first or second offset compensation register. For example, in response to the corresponding differential phase signal increasing, the first power or control signal may be increased, and, in response to the corresponding differential phase signal decreasing, the first power or control signal may be decreased.

The effect of the phase differences in the first or second output clock signals are represented in the power signal AVcc_reg such that the power signal AVcc_reg presents a negative feedback phase signal for the first or second oscillator circuit. Therefore, after the loop settles, the phase differences in the first or second output clocks are optimized to be equal or to be substantially equal to a target value, such as 45 degrees.

Figure 6:
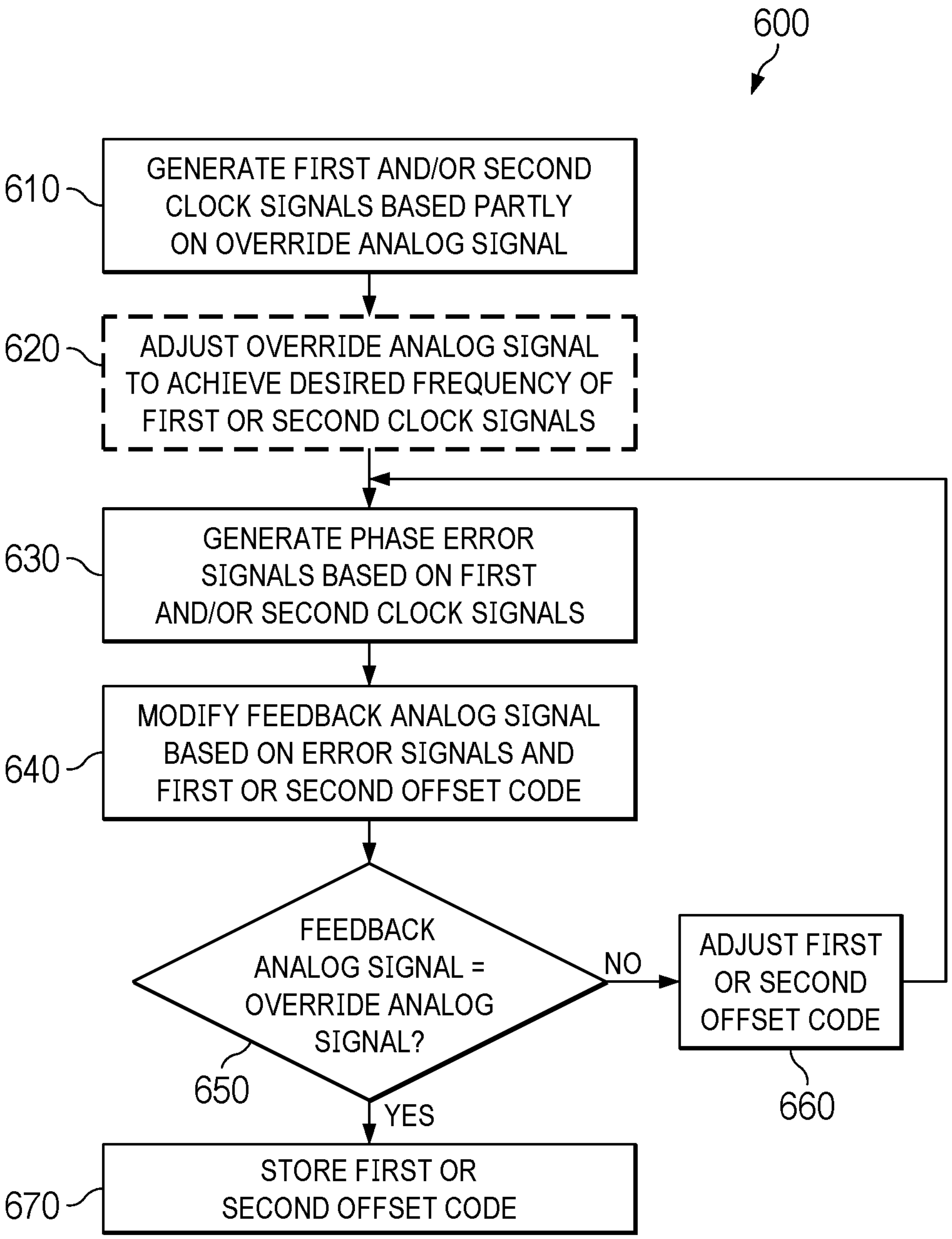
FIG. 6 is a flowchart diagram illustrating a method of operating an oscillator circuit according to some implementations.

FIG. 6 is a flowchart diagram illustrating a method 600 of calibrating an oscillator circuit according to some implementations. Method 600 may be performed, for example, by oscillator circuit 400, or by controller 450 of oscillator circuit 400. Method 600 may be performed by other oscillator circuits or controllers.

At block 610, the controller causes first and/or second output clocks to be generated based partly on an override control signal. For example, the controller may provide a digital frequency code to a DAC, and in response to the digital frequency code, the DAC may generate an override control signal. The controller may also cause a multiplexor to provide the override control signal to a gate of a power supply transistor, which, in response to the override control signal, generates a power signal for first and second oscillator circuits. In response to the power signal, the first and second oscillator circuits respectively generate first and second output clocks, where the first and second output clocks have a frequency corresponding with the digital frequency code.

At block 620, the controller adjusts the digital frequency code so that the frequency of the first and/or second output clocks is within a threshold of a predetermined target frequency. In some embodiments, the digital frequency code corresponding to the frequency of the first and second output clocks being within the threshold of the predetermined target frequency, is stored in a memory.

In some embodiments, the digital frequency code may have been determined prior to method 600 being performed. Accordingly, some embodiments of method 600 include block 620, and other embodiments of method 600 do not include block 620.

At block 630, while the first and/or second output clocks are being generated based partly on the override control signal, a phase error signal is generated based on the first output clocks or the second output clocks. For example, a differential phase error signal may be generated based on particular pairs of the first or second output clock signals. For example, phase differences between any of a first set of pairs of the first or second output clock signals may cause the differential phase error signal to increase, and phase differences between any of a second set of pairs of the first or second output clock signals may cause the differential phase error signal to decrease.

At block 640, a feedback control signal is adjusted based on the phase error signal generated at block 630 and based on a current offset compensation code, for example, stored in an offset compensation register. In this embodiment, the feedback control signal does not affect the output clocks generated at block 610. For example, in response to the phase error signal increasing, the feedback control signal may be increased, and, in response to the phase error signal decreasing, the feedback control signal may be decreased.

At block 650, the controller determines whether a difference between the feedback control signal and the override control signal is less than a threshold.

If, at 650, the difference between the feedback control signal and the override signal is determined to not be less than the threshold, at 660 the offset compensation code in the offset compensation register is changed.

If, at 650, the difference between the feedback control signal and the override signal is determined to be less than the threshold, at 670, the current offset compensation code used at block 640 is stored in a memory, which may be either of the first and second offset compensation registers or another memory.

Figure 7:
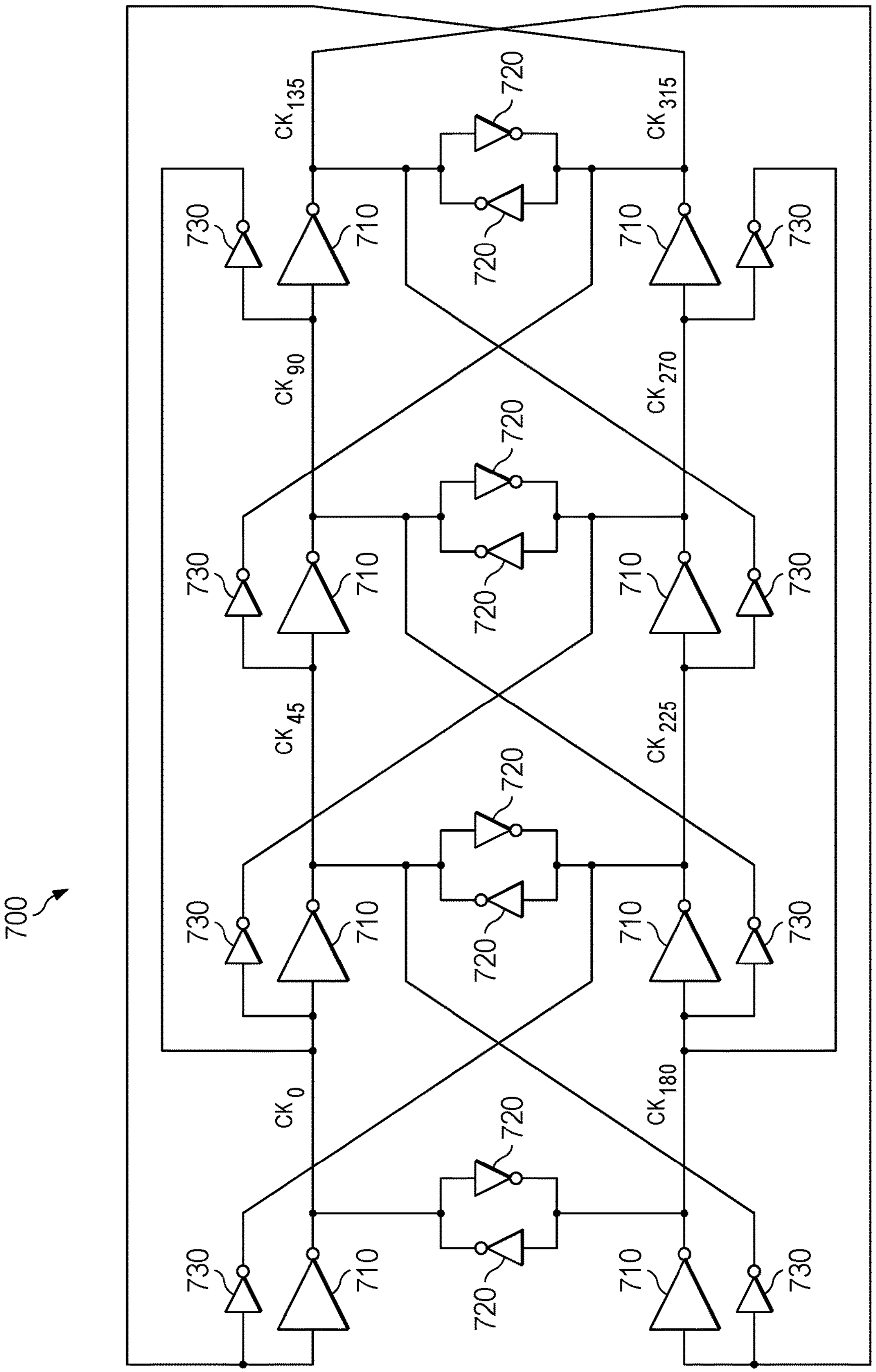
FIG. 7 illustrates a portion of an injection locked ring oscillator (ILRO) circuit according to some implementations.

FIG. 7 illustrates a portion of an injection locked ring oscillator (ILRO) circuit 700 according to some implementations. ILRO circuit 700 may be used as ILRO circuit 110 of FIG. 1 or as either of ILRO circuits 411 and 412 of FIG. 4. Oscillator circuit 100 may use other implementations of ILRO circuits. ILRO circuit 700 includes delay elements 710, coupling inverters 720, and feed forward/back inverters 730. ILRO circuit 700 may also include injection drivers configured to inject signals at various clock nodes. For example, injections drivers may be configured to inject signals at nodes CK135 and CK315 for clock signals INJcks1 or INJcks2.

ILRO circuit 700 is configured to receive injection control signals and to receive injection clock signals, and is configured to receive a power signal, which provides power to each of the delay elements 710, coupling inverters 720, and feed forward/back inverters 730. Furthermore, ILRO circuit 700 is configured to generate output clock signals CK0, CK45, CK90, CK135, CK180, CK225, CK270, and CK315 based on the injection control signals, the injection clock signals INJ0 and INJ180, and power signal.

Delay elements 710, coupling inverters 720, and feed forward/back inverters 730 form part of an injection locked ring oscillator circuit, which operates based on delay times of the delay elements 710 and based on injection signals from injection drivers. The delay times of the delay elements 710 are influenced by the power signal.

Figure 8:
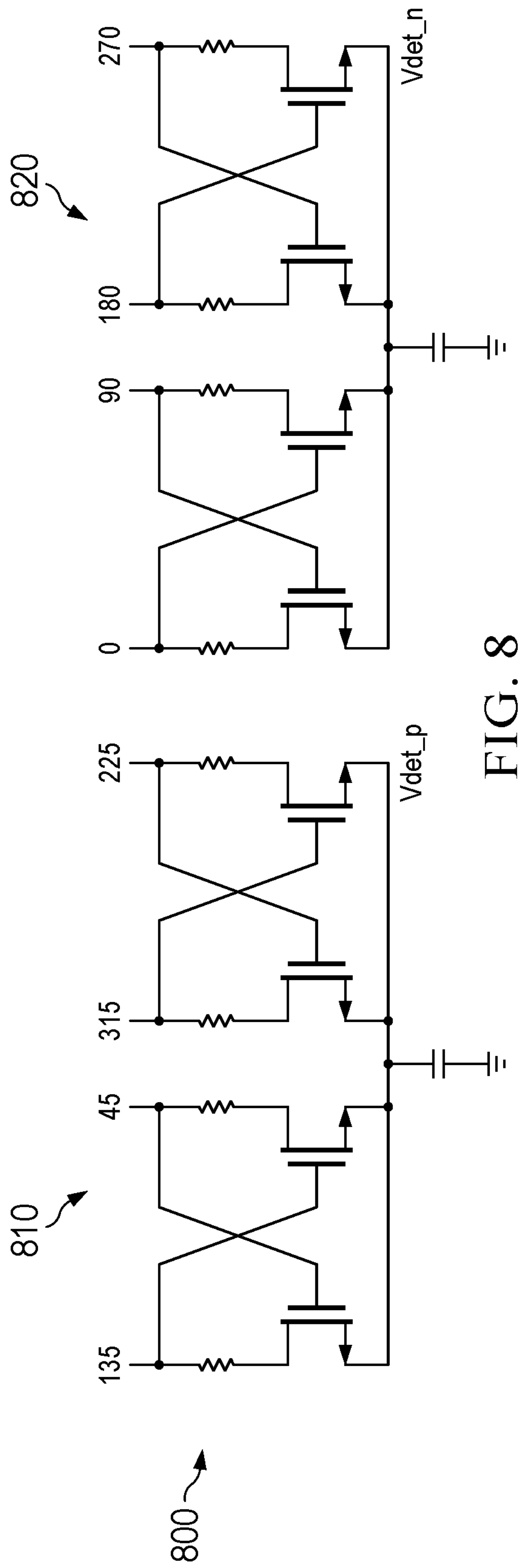
FIG. 8 illustrates a phase detector circuit according to some implementations.

FIG. 8 illustrates a phase detector circuit 800 according to some implementations. Phase detector circuit 800 may be used, for example, as phase detector circuit 120 of FIG. 1 or as either of phase detector circuits 421 and 422 of FIG. 4. Oscillator circuit 100 may use other implementations of phase detector circuits. In this implementation, phase detector circuit 800 includes four mixer circuits 810 and 820.

Phase detector circuit 800 receives clock signals CK0, CK45, CK90, CK135, CK180, CK225, CK270, and CK315 and generates a differential phase output signal (Vdet_p-Vdet_n) based on phase differences of pairs of the clock signals.

In the illustrated implementation, phase differences between any of output clock signals CK135 and CK45, and output clock signals CK315 and CK225 cause the phase detector circuit 800 to increase the differential phase output signal. In the illustrated implementation, phase differences between any of clock signals CK0 and CK90 and output clock signals CK180 and CK270 cause the phase detector circuit 800 to decrease the differential phase output signal.

Figure 9:
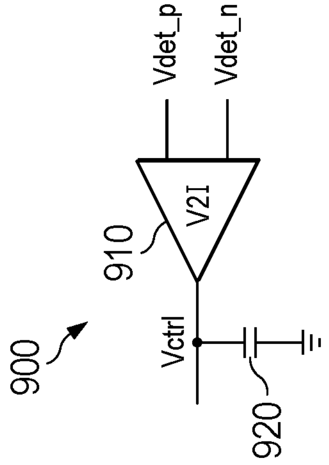
FIG. 9 illustrates a gain stage circuit according to some implementations.

FIG. 9 illustrates a gain stage circuit 900 according to some implementations. Gain stage circuit 900 may be used, for example, as gain stage circuit 130 of FIG. 1 or either of gain stage circuits 431 and 432. Gain stage circuit 900 includes voltage to current circuit 910, and capacitor 920. Gain stage circuit 900 is configured to receive a differential phase output signal (Vdet_p-Vdet_n), and to generate a control signal Vctrl based on the differential phase output signal.

Voltage to current circuit 910 may be any amplification circuit known in the art. For example, voltage to current circuit 910 may be configured to generate a current substantially equal to a constant times a difference between the Vdet_p and Vdet_n input signals until its output voltage is close to its supply or ground voltages. Accordingly, in response to the Vdet_p signal being greater than the Vdet_n signal, the output current from the voltage to current circuit 910 is greater than 0, and, in response to the Vdet_p signal being less than the Vdet_n signal, the output current from the voltage to current circuit 910 is less than 0.

The voltage of capacitor 920 (equal to the control signal Vctrl), represents an integration of the current output of the voltage to current circuit 910.

In some embodiments, the voltage to current circuit 910 contains a current digital-to-analog converter, such as that illustrated. The current DAC converts the offset compensation code received from the offset compensation register to a compensation offset current such that the offset of the amplifier can be tuned. The offset is tuned to counteract any offset from the phase detector circuit or the amplifier 910 itself.

One general aspect is a method of using an oscillator circuit, the method including: with an oscillator, generating a plurality of output clock signals based on an override control signal; with a phase detector circuit, generating a phase error signal based on the output clock signals; with a gain stage circuit, modifying a feedback control signal based on the phase error signal and an offset compensation code; with a controller, modifying the offset compensation code; with a comparator, generating an equality signal indicating that the feedback control signal is equal to the override control signal; and with the controller, in response to the equality signal, causing the modified offset compensation code to be stored.

Implementations may include one or more of the following features. The method, further including, with a power supply transistor of the oscillator circuit, generating a power voltage for the oscillator based on the override control signal. The method, further including, with a multiplexor of the oscillator circuit, providing the override control signal to a gate of the power supply transistor. The method, further including, with a digital to analog converter of the oscillator circuit, generating the override control signal based on a frequency code generated by the controller. The method, further including, with the comparator, generating the equality signal based on a difference between the feedback control signal and the override control signal. The method, where the offset compensation code causes the gain stage circuit to compensate for an offset generated by either or both of the phase detector circuit and the gain stage circuit. The method, further including, with a second oscillator of the oscillator circuit, generating a second plurality of output clocks based on the override control signal. The method, further including, with the oscillator of the oscillator circuit, generating a second plurality of output clock signals based on the stored offset compensation code.

One general aspect is a method of using an oscillator, the method including: providing a power voltage generated based on an override control signal to the oscillator; generating a feedback control signal based on an offset compensation code; modifying the offset compensation code until the feedback control signal is equal to the override control signal; and causing the modified offset compensation code to be stored.

Implementations may include one or more of the following features. The method, further including, with a power supply transistor, generating the power voltage based on the override control signal. The method, further including, with a multiplexor, providing the override control signal to a gate of the power supply transistor. The method, further including, with a digital to analog converter, generating the override control signal based on a frequency code. The method, further including, with a comparator, generating an indication that the feedback control signal is equal to the override control signal. The method, further including, generating a plurality of output clock signals based on the stored offset compensation code.

One general aspect is an oscillator circuit, including: an oscillator, configured to generate a plurality of output clock signals based on an override control signal; a phase detector circuit, configured to generate a phase error signal based on the output clock signals; a gain stage circuit, configured to modify a feedback control signal based on the phase error signal and on an offset compensation code; a controller, configured to modify the offset compensation code and to cause the modified offset compensation code to be stored; and a comparator, configured to generate an equality signal indicating that the feedback control signal is equal to the override control signal.

Implementations may include one or more of the following features. The oscillator circuit of, further including a power supply transistor, configured to generate a power voltage for the oscillator based on the override control signal. The oscillator circuit, further including a multiplexor, configured to provide the override control signal to a gate of the power supply transistor. The oscillator circuit, further including a digital to analog converter, configured to generate the override control signal based on a frequency code generated by the controller. The oscillator circuit, where the comparator is configured to generate the equality signal based on a difference between the feedback control signal and the override control signal. The oscillator circuit, where the oscillator is configured to generate a second plurality of output clock signals based on the stored offset compensation code.

While this invention has been described with reference to illustrative implementations, this description is not intended to be construed in a limiting sense. Various modifications and combinations of the illustrative implementations, as well as other implementations of the invention, will be apparent to persons skilled in the art upon reference to the description. It is therefore intended that the appended claims encompass any such modifications or implementations.

What is claimed is:

1. A method of using an oscillator circuit, the method comprising:

with an oscillator, generating a plurality of output clock signals based on an override control signal;

with a phase detector circuit, generating a phase error signal based on the output clock signals;

with a gain stage circuit, modifying a feedback control signal based on the phase error signal and an offset compensation code;

with a controller, modifying the offset compensation code;

with a comparator, generating an equality signal indicating that the feedback control signal is equal to the override control signal; and with the controller, in response to the equality signal, causing the modified offset compensation code to be stored.

2. The method of claim 1, further comprising, with a power supply transistor of the oscillator circuit, generating a power voltage for the oscillator based on the override control signal.

3. The method of claim 2, further comprising, with a multiplexor of the oscillator circuit, providing the override control signal to a gate of the power supply transistor.

4. The method of claim 1, further comprising, with a digital-to-analog converter of the oscillator circuit, generating the override control signal based on a frequency code generated by the controller.

5. The method of claim 1, further comprising, with the comparator, generating the equality signal based on a difference between the feedback control signal and the override control signal.

6. The method of claim 1, wherein the offset compensation code causes the gain stage circuit to compensate for an offset generated by either or both of the phase detector circuit and the gain stage circuit.

7. The method of claim 1, further comprising, with a second oscillator of the oscillator circuit, generating a second plurality of output clock signals based on the override control signal.

8. The method of claim 1, further comprising, with the oscillator of the oscillator circuit, generating a second plurality of output clock signals based on the stored offset compensation code.

9. A method of using an oscillator, the method comprising:

providing a power voltage generated based on an override control signal to the oscillator;

generating, using a phase detector, a phase error signal based on a phase error between at least two phases generated by the oscillator;

generating a feedback control signal based on an offset compensation code and the phase error signal;

modifying the offset compensation code until the feedback control signal is equal to the override control signal; and causing the modified offset compensation code to be stored.

10. The method of claim 9, further comprising, with a power supply transistor, generating the power voltage based on the override control signal.

11. The method of claim 10, further comprising, with a multiplexor, providing the override control signal to a gate of the power supply transistor.

12. The method of claim 9, further comprising, with a digital-to-analog converter, generating the override control signal based on a frequency code.

13. The method of claim 9, further comprising, with a comparator, generating an indication that the feedback control signal is equal to the override control signal.

14. The method of claim 9, further comprising generating a plurality of output clock signals based on the stored offset compensation code.

15. An oscillator circuit, comprising:

an oscillator, configured to generate a plurality of output clock signals based on an override control signal;

a phase detector circuit, configured to generate a phase error signal based on the output clock signals;

a gain stage circuit, configured to modify a feedback control signal based on the phase error signal and on an offset compensation code;

a controller, configured to modify the offset compensation code and to cause the modified offset compensation code to be stored; and a comparator, configured to generate an equality signal indicating that the feedback control signal is equal to the override control signal.

16. The oscillator circuit of claim 15, further comprising a power supply transistor, configured to generate a power voltage for the oscillator based on the override control signal.

17. The oscillator circuit of claim 16, further comprising a multiplexor, configured to provide the override control signal to a gate of the power supply transistor.

18. The oscillator circuit of claim 15, further comprising a digital-to-analog converter, configured to generate the override control signal based on a frequency code generated by the controller.

19. The oscillator circuit of claim 15, wherein the comparator is configured to generate the equality signal based on a difference between the feedback control signal and the override control signal.

20. The oscillator circuit of claim 15, wherein the oscillator is configured to generate a second plurality of output clock signals based on the stored offset compensation code.

* * * * *